(12) United States Patent
North et al.

(10) Patent No.: US 12,250,770 B2
(45) Date of Patent: Mar. 11, 2025

(54) BOARD EDGE ELECTRICAL CONTACT STRUCTURES

(71) Applicant: NOKIA SOLUTIONS AND NETWORKS OY, Espoo (FI)

(72) Inventors: David North, Santa Clara, CA (US); Daniel Anav, San Jose, CA (US); David Harvey, Stittsville (CA); Scott David Dsouza, Stittsville (CA); Alex Chan, Ottawa (CA); Paul James Brown, Wakefiled (CA)

(73) Assignee: NOKIA SOLUTIONS AND NETWORKS OY, Espoo (FI)

( * ) Notice: Subject to any disclaimer, the term of this patent is extended or adjusted under 35 U.S.C. 154(b) by 206 days.

(21) Appl. No.: 17/995,961

(22) PCT Filed: Apr. 13, 2021

(86) PCT No.: PCT/US2021/027073
§ 371 (c)(1),
(2) Date: Oct. 11, 2022

(87) PCT Pub. No.: WO2021/211577
PCT Pub. Date: Oct. 21, 2021

(65) Prior Publication Data
US 2023/0232533 A1 Jul. 20, 2023

Related U.S. Application Data

(60) Provisional application No. 63/010,255, filed on Apr. 15, 2020.

(51) Int. Cl.
*H05K 1/11* (2006.01)
*H05K 3/00* (2006.01)
*H05K 3/34* (2006.01)

(52) U.S. Cl.
CPC ............ *H05K 1/117* (2013.01); *H05K 1/113* (2013.01); *H05K 3/0026* (2013.01);
(Continued)

(58) Field of Classification Search
CPC ...... H05K 1/117; H05K 1/113; H05K 3/0026; H05K 3/0044; H05K 2201/10446
(Continued)

(56) References Cited

U.S. PATENT DOCUMENTS 3,993,935 A  11/1976  Phillips
5,383,095 A *  1/1995  Korsunsky ........... H05K 3/3405
                                                        439/62

(Continued)

FOREIGN PATENT DOCUMENTS

DE        4438449 A1 *  7/1996  ............ H01L 23/13
EP        2134146 A1     6/2008
WO    2006075290 A1     7/2006

OTHER PUBLICATIONS

'Marc de Samber, et al., "A New Embedded Packaging Technology for High Power LEDs", 2008 10th Electronics Packaging Technology Conference, pp. 242-248.
(Continued)

*Primary Examiner* — Andargie M Aychillhum
(74) *Attorney, Agent, or Firm* — Kramer & Amado, P.C.

(57) ABSTRACT

A printed circuit board for mounting electrical components thereupon include: a first side; a second side opposite the first side; electrical connection points disposed on the surface of an exterior edge of the printed circuit board; and wherein the exterior edge of the printed circuit board is between the first side and the second side. Further a method of manufacturing a printed circuit board for mounting electrical components thereupon includes the steps of disposing interconnect structures within the printed circuit board adja- (Continued)

cent to at least one edge of the printed circuit board; and removing material from the printed circuit board edge to expose the interconnect structures such that the exposed interconnect structures correspond to a component connection footprint.

18 Claims, 7 Drawing Sheets

(52) U.S. Cl.
CPC ......... *H05K 3/0044* (2013.01); *H05K 3/3405* (2013.01); *H05K 2201/10446* (2013.01); *H05K 2203/0228* (2013.01)

(58) Field of Classification Search
USPC .......................................................... 174/250
See application file for complete search history.

(56) References Cited

U.S. PATENT DOCUMENTS

| | | | |
|---|---|---|---|
| 9,706,092 B1 | 7/2017 | Tam et al. | |
| 2006/0065432 A1 | 3/2006 | Kawauchi | |
| 2008/0168651 A1* | 7/2008 | Bhatt | H05K 1/112 |
| | | | 29/830 |
| 2013/0044476 A1 | 2/2013 | Bretschneider | |
| 2013/0183862 A1 | 7/2013 | Ni | |
| 2016/0172293 A1 | 6/2016 | Shelsky | |
| 2019/0045633 A1* | 2/2019 | Chuo | H05K 1/0393 |
| 2020/0196448 A1* | 6/2020 | Punjabi | H05K 1/115 |

OTHER PUBLICATIONS

International Search Report and Written Opinion for PCT/US2021/027073 mailed Sep. 1, 2021.

* cited by examiner

BOARD EDGE ELECTRICAL CONTACT STRUCTURES

TECHNICAL FIELD

Various exemplary embodiments disclosed herein relate generally to board edge electrical contact structures and is particularly concerned with providing electrical contacts for higher density component placement.

BACKGROUND

In telecommunications networking equipment, increases in component count and placement density have consumed the vast majority of board real estate available, leaving very little viable space for additional components.

SUMMARY

A summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Means for repurposing existing conventional and non-conventional PCB interconnect structures to provide both electrical connectivity and physical attachment means for additional components across vertical edge of the PCB are disclosed. Advantages of embodiments disclosed herein may include: simplifying assembly operations by combining as much of it as possible into the existing surface mount technology (SMT) assembly process, and while also providing additional protection to surface mounted components.

According to an aspect of the embodiments disclosed herein there is provided a printed circuit board for mounting electrical components thereupon, the printed circuit board having a first side; a second side opposite the first side; electrical connection points disposed on the surface of an exterior edge of the printed circuit board; and wherein the exterior edge of the printed circuit board is between the first side and the second side. According to an aspect of this embodiment, the exterior edge has a ledge relieved therein; and the electrical connection points are disposed on the ledge. In some of these embodiments the electrical connection points include printed circuit board component lands.

According to another aspect of this embodiment, the electrical connection points comprise exposed vertical interconnect structures. In some of these embodiments the vertical interconnect structures had been exposed by at least one of either edge milling or laser ablation operations. In some of these embodiments the vertical interconnect structures comprise plated through hole vias.

In accordance with another aspect of the embodiment disclosed herein there is provided a method of manufacturing a printed circuit board for mounting electrical components thereupon having the steps of: disposing interconnect structures within the printed circuit board adjacent at least one edge of the printed circuit board; and removing material from the printed circuit board edge to expose the interconnect structures such that the exposed interconnect structures correspond to a component connection footprint.

In some of these embodiments the removing material step is done by at least one of edge milling or laser ablation operations.

In some of these embodiments there is the further step of providing the printed circuit board with a lamination barrier layer disposed adjacent to the interconnect structures; and wherein the removing material step comprises removing printed circuit board material until the lamination barrier layer is reached by at least one of the set of edge milling and laser ablation operations; and removing the lamination barrier layer.

In some of these embodiments the component connection footprint comprises surface mount technology component lands.

In some of these embodiments there is the additional steps of reflow soldering at least one surface mount technology component to the component lands. In some of these embodiments the at least one surface mount technology component is a Light Emitting Diode.

Various embodiments relate to a printed circuit board for mounting electrical components thereupon including: a first side; a second side opposite the first side; electrical connection points disposed on the surface of an exterior edge of the printed circuit board; and wherein the exterior edge of the printed circuit board is between the first side and the second side.

Various embodiments are described, wherein the exterior edge has a plurality of cavities therein, and the electrical connection points are disposed in at least one of the cavities.

Various embodiments are described, wherein the electrical connection points include printed circuit board component pads.

Various embodiments are described, wherein a portion of the printed circuit board layer covering the electrical connection points covers a portion of the electrical connection points in the plurality of cavities.

Various embodiments are described, wherein the electrical connection points include exposed vertical interconnect structures.

Various embodiments are described, wherein the vertical interconnect structures had been exposed by at least one of edge milling and laser ablation operations.

Various embodiments are described, wherein the vertical interconnect structures include plated through hole vias.

Various embodiments are described, further including: an interposer board with electronic components mounted on a first side and a second side with lands connected to the electronic components, wherein the lands are connected to the vertical interconnect structures.

Various embodiments are described, wherein the lands of the interposer board are soldered to the vertical interconnect structures of the printed circuit board.

Various embodiments are described, further including: electrical interconnects attached to the lands of the interposer board, wherein the electrical interconnects include connection pins configured to engage the vertical interconnect structures; and a plurality of clips attached to the printed circuit board configured to engage the interposer board and to secure the interposer board to the printed circuit board.

Various embodiments are described, wherein the exterior edge has a ledge formed thereon, and the electrical connection points are disposed on the ledge.

Further various embodiments relate to a method of manufacturing a printed circuit board for mounting electrical components thereupon including the steps of: disposing interconnect structures within the printed circuit board adjacent at least one edge of the printed circuit board; and removing material from the printed circuit board edge to expose the interconnect structures such that the exposed interconnect structures correspond to a component connection footprint.

Various embodiments are described, wherein the removing material step is done by at least one of edge milling and laser ablation operations.

Various embodiments are described, further including: providing the printed circuit board with a lamination barrier layer disposed adjacent to the interconnect structures; and wherein the removing material step includes: removing printed circuit board material until the lamination barrier layer is reached by at least one of edge milling and laser ablation operations; and removing the lamination barrier layer.

Various embodiments are described, wherein removing the lamination barrier includes mechanically removing the lamination barrier.

Various embodiments are described, wherein removing the lamination barrier includes chemically removing the lamination barrier.

Various embodiments are described, wherein the lamination barrier is removed when the printed circuit board material is removed.

Various embodiments are described, wherein the component connection footprint includes surface mount technology component lands.

Various embodiments are described, further including the step of: reflow soldering at least one surface mount technology component to the component lands.

Various embodiments are described, wherein the at least one surface mount technology component is a Light Emitting Diode.

Various embodiments are described, wherein the exposed interconnect structures include vertical interconnect structures.

Various embodiments are described, further including reflow soldering at least one surface mount technology component to the vertical interconnect structures.

Various embodiments are described, further including reflow soldering an interposer board to the vertical interconnect structures, wherein the interposer board includes electronic components mounted on a first side and a second side with lands connected to the electronic components, wherein the lands are connected to the vertical interconnect structures.

Various embodiments are described, further including connecting an interposer board to the vertical interconnect structures using a plurality of interconnects and a plurality of clips, wherein
the interposer board includes electronic components mounted on a first side and a second side with lands connected to the electronic components, the plurality of electrical interconnects is attached to the lands of the interposer board, wherein the electrical interconnects include connection pins configured to engage the vertical interconnect structures, and the plurality of clips is attached to the printed circuit board and configured to engage the interposer board and to secure the interposer board to the printed circuit board.

Various embodiments are described, wherein the removing material step includes removing a first portion of the printed circuit board by edge milling and removing a second portion of the printed circuit board using laser ablation operations, wherein the thickness of the first portion is greater than the thickness of the second portion.

BRIEF DESCRIPTION OF THE DRAWINGS

In order to better understand various exemplary embodiments, reference is made to the accompanying drawings, wherein.

To facilitate understanding, identical reference numerals have been used to designate elements having substantially the same or similar structure and/or substantially the same or similar function.

DETAILED DESCRIPTION

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments.

In telecommunications networking equipment, increases in component counts and placement density have consumed the vast majority of Printed Circuit Board (PCB) real estate leaving very little viable space for other features.

The only remaining area of the PCB that is available is that corresponding to the very edge of the PCB. While physically adequate to fit additional electronic components, this space is devoid of any conventional means of running power or signaling circuits to these electronic components.

Accordingly, what is required is some means of utilizing the PCB edge for additional electronic component placement. PCB edge milling is an established albeit less common PCB process that is generally used to reduce the thickness of the PCB edge for mechanical reasons.

Figure 1:
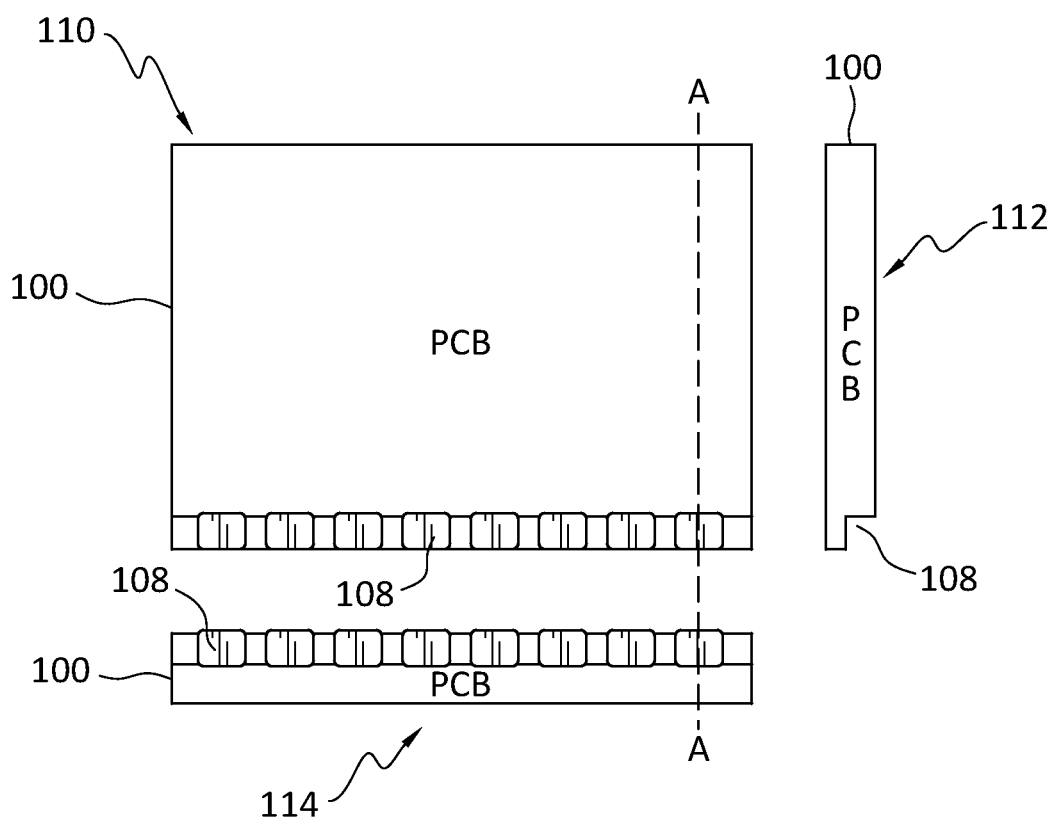
FIG. 1 illustrates three views of a PCB where an edge milling operation is used to create a plurality of cavities in the edge of the PCB.

FIG. 1 illustrates three views of a PCB where an edge milling operation is used to create a plurality of cavities in the edge of the PCB. A top view 110, a cross-sectional view along line AA 112, and front edge view 114 of the PCB 100 are illustrated. The PCB 100 may include a plurality of cavities 108 along the edge of the PCB 100 that selectively expose a predetermined internal layer along the front edge of the PCB 100. The internal layer exposed by the cavity 108 is designed in such a way that the circuit pattern defined on this layer corresponds to a suitable land pattern for an Surface Mount Technology (SMT) component. The cavity may be formed by mechanical milling, laser ablation, or a combination thereof.

Figure 2:
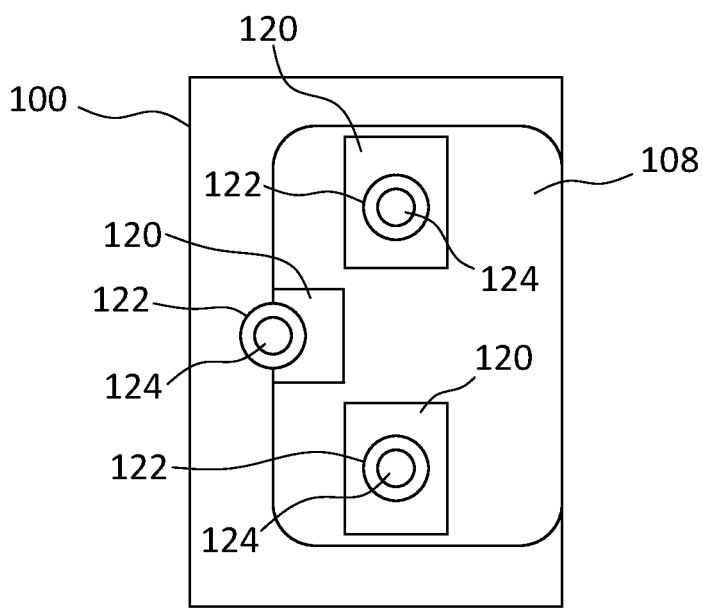
FIG. 2 illustrates a view of a cavity of FIG. 1 with electrical connections on the exposed layer of the PCB.

FIG. 2 illustrates a view of a cavity of FIG. 1 with electrical connections on the exposed layer of the PCB. The exposed layer includes three different pads 120. Such pads 120 may be made of copper or any other commonly used conductive material. The three pads 120 may correspond to three terminals on a three terminal electronic component. The pads 120 may be over vias 122. The vias 122 provide connections to other layers in the PCB 100. The vias 122 may include a conductive layer that provides the electrical connection to the other layers. Further the via 122 may include a central region 124 that may either be open or filled depending on the specific application. In alternative embodiments, the vias may not be within the cavity but elsewhere on the exposed layer. In this situation depending upon the location of the via, the top of the via may or may not be exposed. In such a case, the pad 120 may be connected to such vias using conductive traces. Further, such conductive traces may be connected to other circuit elements connected to the exposed layer without the use of vias.

Given that the edge milling depth accuracy by itself may be too coarse to reliably expose a given internal layer (which might generally require an accuracy of the order of 0.001" or better) the edge routing process may be combined with laser ablation (as used in for example microvia formation) or the application of a lamination barrier. For example, milling may be used to remove the bulk of the PCB to get near to the layer that includes the pad. Then laser ablation can remove the remaining layer accurately to expose the pads used to connect to the SMT component.

Figures 3A, 3B, 3C:
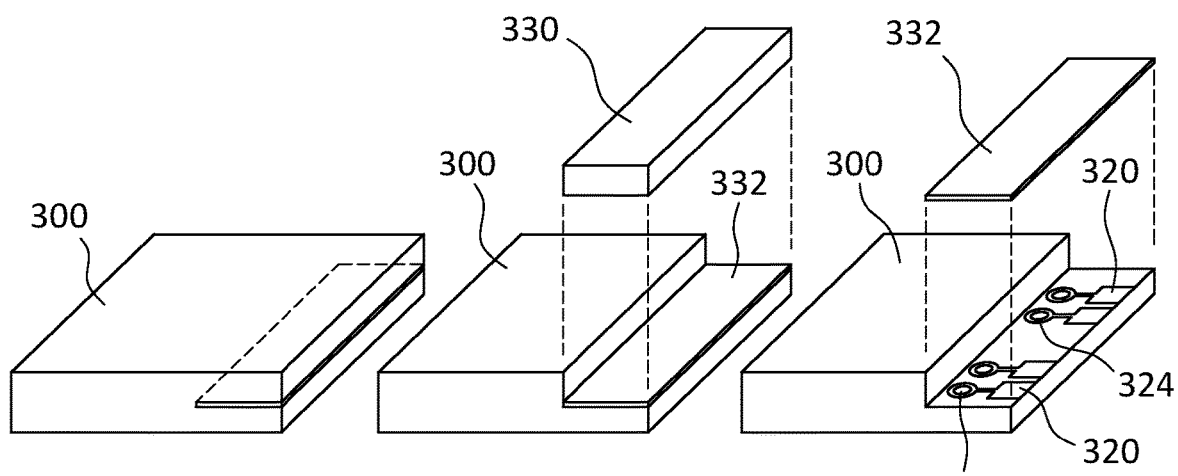
FIG. 3A illustrates a PCB having a lamination barrier over the area where electronic components will be connected.
FIG. 3B illustrates the removal of a portion of the PCB using edge milling, v-scoring, or any other removal procedure that will allow for the exposure lamination barrier.
FIG. 3C illustrates the removal of the lamination barrier using either mechanical means or chemical means as described above.

FIGS. 3A, 3B, and 3C illustrate the use of a lamination barrier to expose conductive contacts for use with an electronic component. The PCB 300 may include a lamination barrier 332 between layers of the PCB 300 that is located near the front edge of the PCB. During the manufacture of the PCB 300, the lamination barrier 332 may be placed between the layers of the PCB 300. Specifically it will be placed over the layer of the PCB that includes the pads 320 that will connect to the SMT components. The pads 320 may further be connected to vias 324 that may provide a connection to other layers of the PCB 300. The thickness, for example 0.001" to 0.010", of the of the lamination barrier 332 may be selected to correspond to the tolerance of the milling operation so that the lamination barrier 332 may be reliably reached by the milling operation without milling accidentally into the PCB layer having the pads 320 and vias 324.

Further, the lamination barrier 332 may be made of a material that does not adhere or adheres minimally to the layers of the PCB 300. Such a material may include, for example, polytetrafluoroethylene (PTFE), polyimide, or cellulose. Such a lamination barrier 332 may be mechanically removed by peeling the exposed lamination barrier 324 off of the PCB 300.

In another embodiment, the lamination barrier 324 may be a material that is coated onto the PCB layer that includes the pads 320 and vias 324. For example, polymeric etch resist materials are widely used in the manufacture of PCBs and may be used as the lamination barrier 324. The deposited material may then be chemically removed.

The process of exposing the pads 320 and vias 324 using a lamination barrier 332 will now be described. In FIG. 3A a PCB 300 having a lamination barrier 332 over the area where electronic components will be connected is illustrated. FIG. 3B illustrates the removal of a portion of the PCB 330 using edge milling, v-scoring, or any other removal procedure that will allow for the exposure lamination barrier 332. FIG. 3C illustrates the removal of the lamination barrier 332 using either mechanical means or chemical means as described above. Alternatively the lamination barrier 332 may be detached from the PCB 300 (through delamination, dissolution, etc.) while still bonded to the portion of the PCB 330 that is removed thus accomplishing both tasks simultaneously.

Now an electronic component may be mounted to the exposed pads 320. Further, once exposed, the circuitry may then be conveniently coated with the surface finish at the same time as the remaining circuitry and ready for assembly operations.

Figures 4A, 4B, 4C:
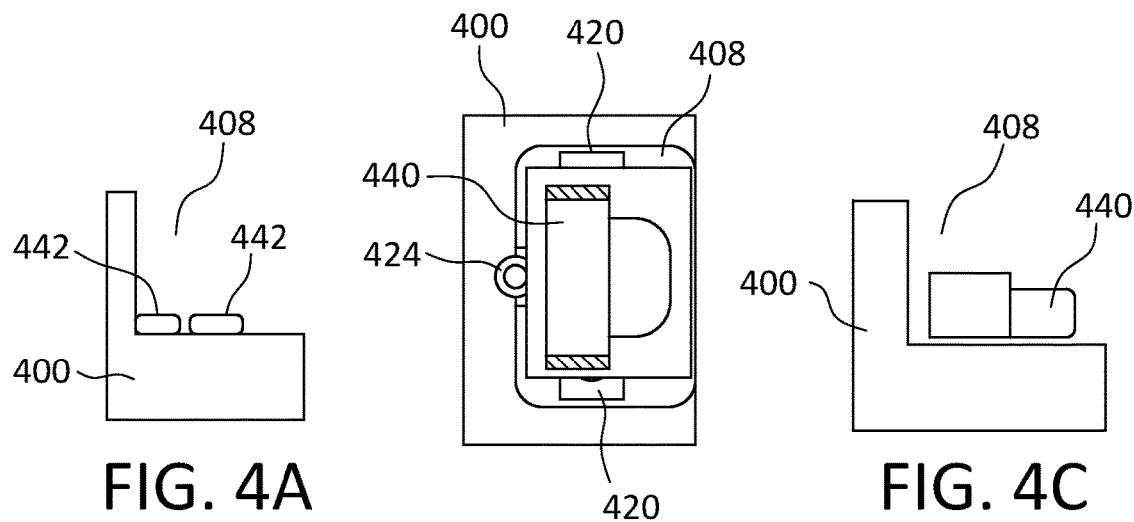
FIG. 4A illustrates a cross-sectional view of a cavity.
FIG. 4B illustrates the placement of electronic components in the cavity.
FIG. 4C illustrates the same view as FIG. 4A with electronic components soldered in place.

FIGS. 4A, 4B, and 4C illustrate the placement of an electronic component on the PCB 400. FIG. 4A illustrates a cross-sectional view of a cavity. Solder paste 442 may be dispensed into the cavity 408 using a paste dispense operation. Next, general pick and place operations as presently used in PCB assembly processes may be used to place an electronic component 440 in the cavity 408 on the solder paste 442. FIG. 4B illustrates the placement of the electronic component 440 in the cavity 408. After all of the electronic components 440 have been placed in the cavities 408, a reflow operation heats the solder paste 442 to facilitate the soldering of the electronic component 440 to the pads 420. The pads 420 may be connected to vias 424. FIG. 4C illustrates the same view as FIG. 4A with electronic components 440 soldered in place. While the placement of the electronic components 440 was described in the cavity 408, the same process may be used to place electronic components on a PCB using the lamination barrier as described above.

Another embodiment for mounting and connecting electronic components to the front edge of a PCB may be accomplished using the modification of vias across the front edge of the PCB so as to be able to act as primary electrical interconnect points and soldering lands for the surface mount components.

Figure 5:
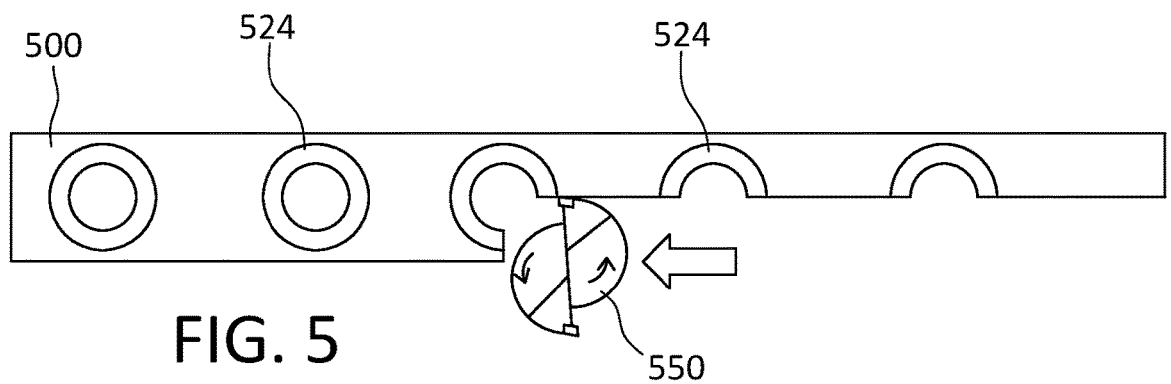
FIG. 5 illustrates the use of milling of vias to create castellated vias to facilitate the mounting of electronic components to the edge of a PCB.

FIG. 5 illustrates the use of milling of vias to create castellated vias to facilitate the mounting of electronic components to the edge of a PCB. An edge of the PCB 500 may include a plurality of vias 524 near the edge of the PCB 500. A milling bit 550 may be used to mill the edge of the PCB 500 to remove a portion of the vias 524 resulting in castellated vias. In FIG. 5 half of the via 524 is shown as being removed, but more or less of the vias 524 may be removed that results in different amounts of the interior of the vias 524 being exposed. The vias 524 may be for example plated through hole (PTH) or another type of via. The vias 524 are located horizontally to correspond to the approximate location of the terminals of the electronic components. This allows for the electronic components to be directly soldered or connected to the castellated vias 524.

Figure 6:
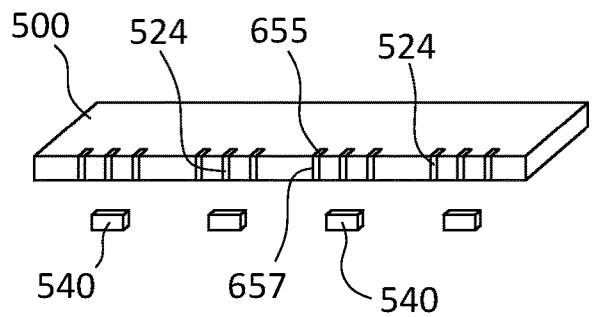
FIG. 6 illustrates the electronic components being directly soldered to castellated vias.

FIG. 6 illustrates the electronic components being directly soldered to castellated vias. As can be seen in FIG. 6, the castellated vias 524 approximately align with the terminals on the electronic components 540. Solder may be applied by stenciling solder paste 655 into the castellated vias 524. Alternatively, a combination of solder paste 655 at the top of the castellated via with the placement of a solder preform 657 into the castellated via as depicted in FIG. 6 may be also used.

Figure 7:
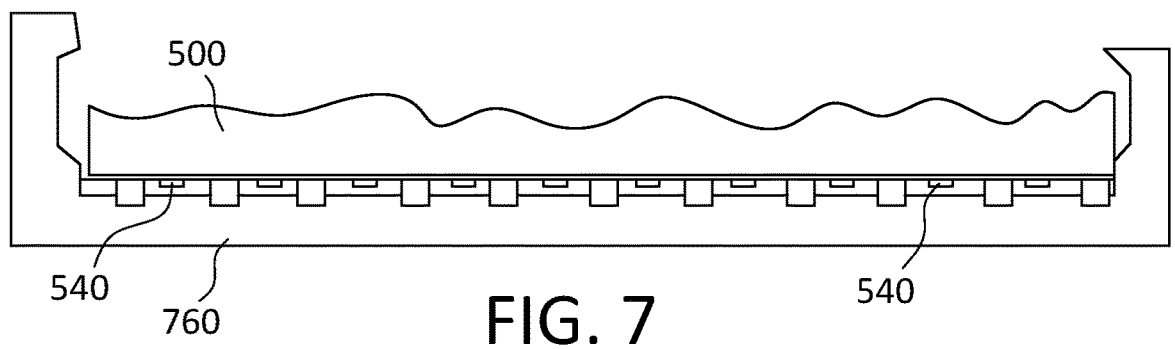
FIG. 7 illustrates a surface mount technology (SMI) carrier that may be used to mount the electronic components to the edge of the PCB.
Figure 8:
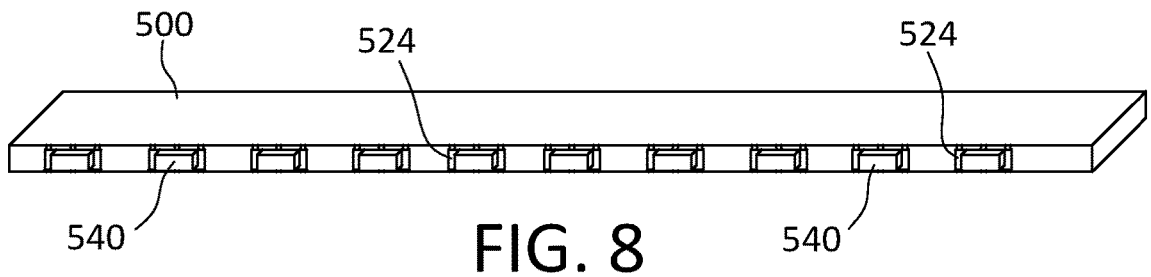
FIG. 8 illustrates electronic components mounted to the castellated vias of the PCB.

Given that conventional surface mount technology (SMT) assembly relies on the component weight (i.e., the force of gravity) and tackiness of the solder paste to remain in place while in the horizontal plane, in the vertical plane, SMT components may have to be held in place through the reflow operation to ensure that they do not shift. FIG. 7 illustrates a surface mount technology (SMT) carrier that may be used to mount SMT components to the edge of the PCB. The SMT carrier 760 may be adapted with cutouts and a supporting high temp silicone foam so as to support the SMT components 540 in place during reflow. Subsequent to the reflow operation, the result would be the SMT component 540 would have been soldered directly to the castellated vias 524 on the front edge of the PCB 500 and the SMT carrier 760 and foam may be removed, leaving the assembly as depicted in FIG. 8.

Figure 9:
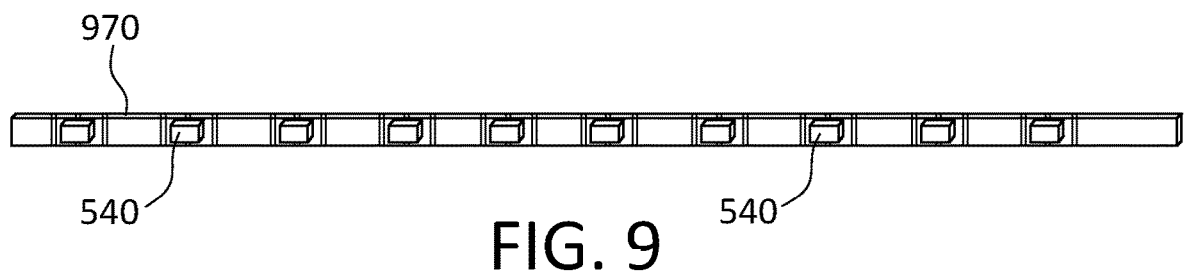
FIG. 9 illustrates an imposer PCB.

FIG. 9 illustrates an interposer PCB. The interposer PCB 970 is an appropriately dimensioned PCB configured to accommodate the component footprint of any preferred electronic components on one side. The associated electrical signals for these electronic components 540 are then routed through this interposer PCB 970 to an alternate land pattern on an alternate side of the interposer PCB 970. The alternate land pattern may correspond directly to a castellated via pattern located on the edge of the PCB. The interposer PCB 970 may be manufactured to add as many electronic components as needed all at once to the interposer PCB 970. This approach allows for the interposer board 970 to be replaceable or to be manufactured separately from the PCB 500 or even to be manufactured by another entity. In some situations manufacturing the interposer PCB 970 may be easier than putting electronic components into cavities on the edge of the PCB 500. Also, in some situations that connection of the interposer PCB 970 to the PCB 500 may be done by hand mechanically without the need for soldering and its associated processing.

This interposer PCB 970 may be first assembled using a conventional SMT process (for example solder-print, component-placement, assembly-reflow), to solder the electronic components to the aforementioned footprints on the initial side of the interposer PCB 970.

Figure 10:
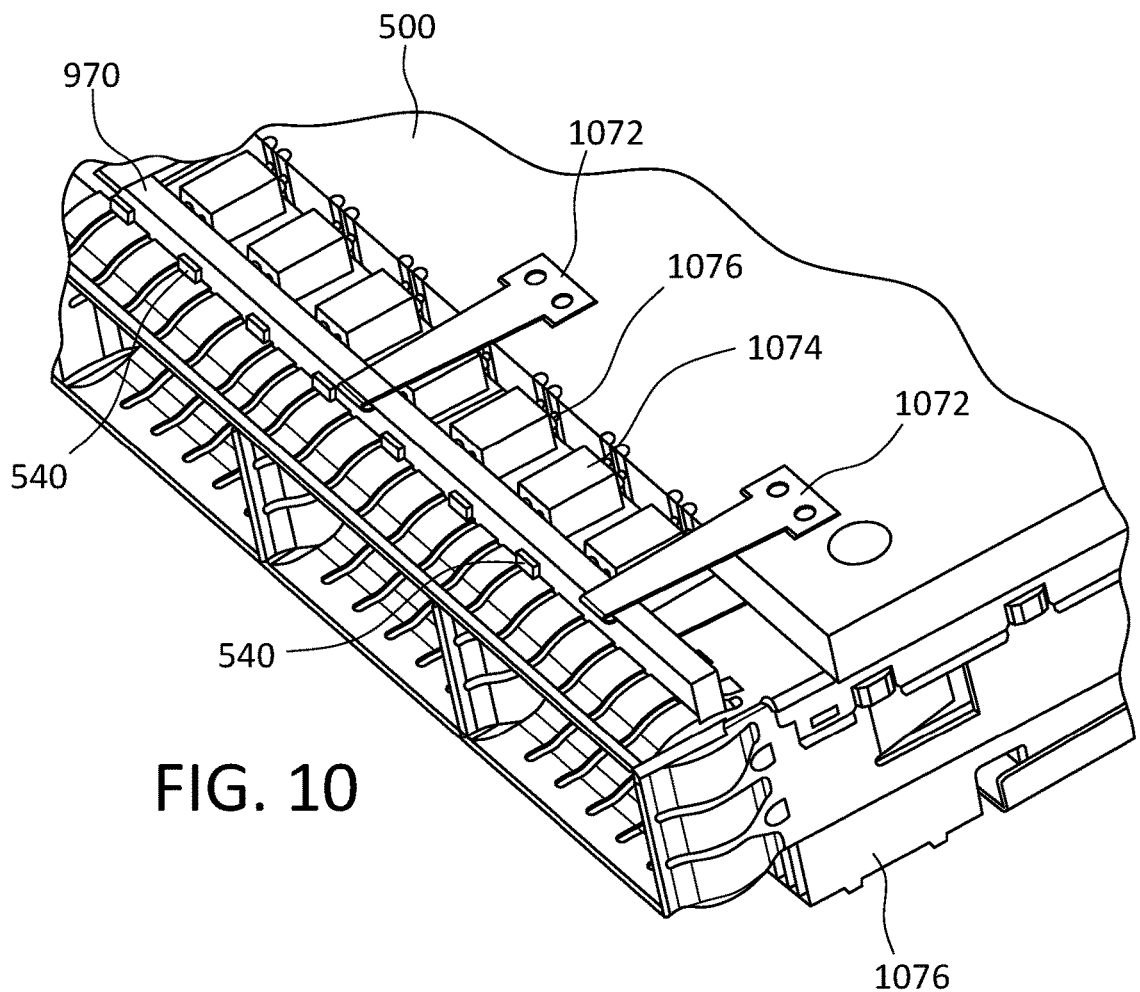
FIG. 10 illustrates an embodiment of mechanically mounting the interposer PCB to the PCB.

Once assembled, the interposer PCB 970 with electronic components may be mechanically mounted to the edge of the PCB 500 that the electronic components are intended for via a series of clips. FIG. 10 illustrates an embodiment of mechanically mounting the interposer PCB 970 to the PCB 500. The PCB 500 is shown mounted on an assembly 1076. Connectors 1074 may be connected to the alternate side of the interposer PCB 970. The connector 1074 may have spring loaded pins 1076 at the end of the connector 1074 opposite the interposer PCB 970. The spring loaded pins 1076 are inserted into the castellated vias 524. Clips 1072 are attached to the PCB 500. An end of the clips 1072 is configured to engage, capture, and fix the interposer PCB 970. The clips 1072 force the connector 1074 into the castellated vias 524 and the spring loaded pins 1076 bias the connector 1074 back against the end of the clips 1072. This results in a secure connection between the interposer PCB 970 and the PCB 500. Further, the use of the clips 1072 allows for the interposer board 970 to be easily replaced if there is an electronic component or other failure of the interposer PCB 970. In such a case the interposer PCB 970 may be removed for repair and a new interposer PCB 970 inserted.

Figure 11:
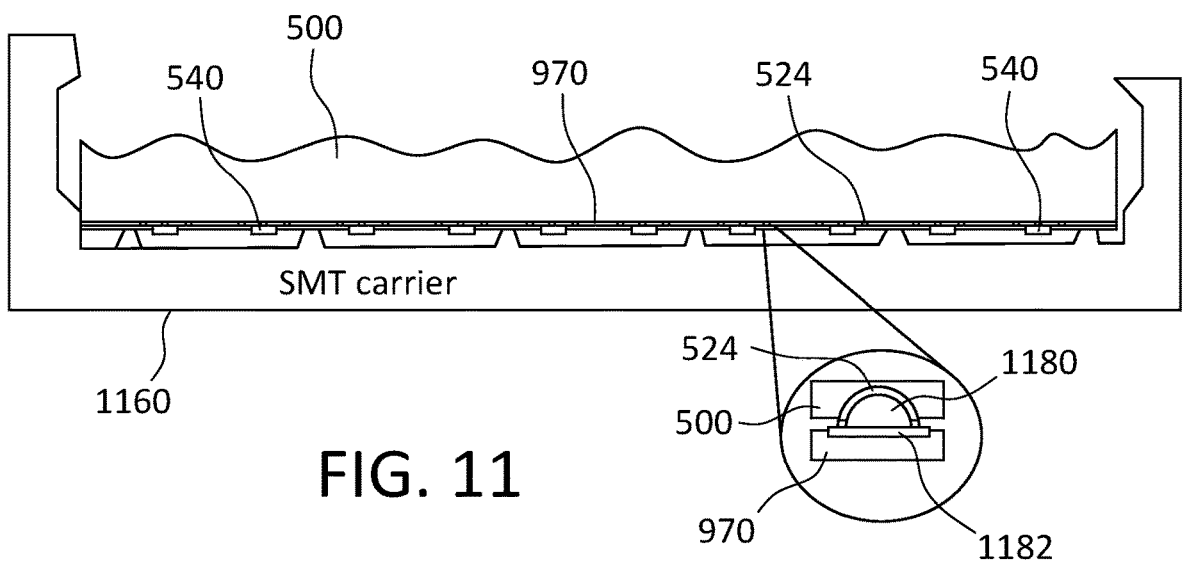
FIG. 11 illustrates an embodiment where the lands of the interposer PCB are held in place for reflow soldering to the castellated via pattern on the edge of the PCB.

FIG. 11 illustrates an embodiment where the lands of the interposer PCB 970 are held in place for reflow soldering to the castellated via pattern on the edge of the PCB 500. The solder paste 1180 may then be reflowed so that the paste deposit is melted into the castellated vias 524 to connect the interposer PCB 970 to the PCB 500. This may be facilitated using a SMT carrier 1160. The SMT carrier 1160 engages the interposer PCB 970 and holds it against the PCB 500 after solder paste 1180 is applied to either the castellated vias 524 or the pads 1182. Further, the SMT carrier 1160 aligns the castellated vias 524 with the pads 1182. Then the solder may be reflowed to facilitate the electrical connection between the castellated vias 524 and the pads 1182. Next, the SMT carrier 1160 may be removed, and the interposer PCB 970 is connected to the PCB 500. It is noted that using this approach, the connections between the interposer PCB 970 and the PCB 500 may be touched up to correct any problems with the connections, because the contacts are accessible from the top or bottom of the PCB 500.

Figure 12:
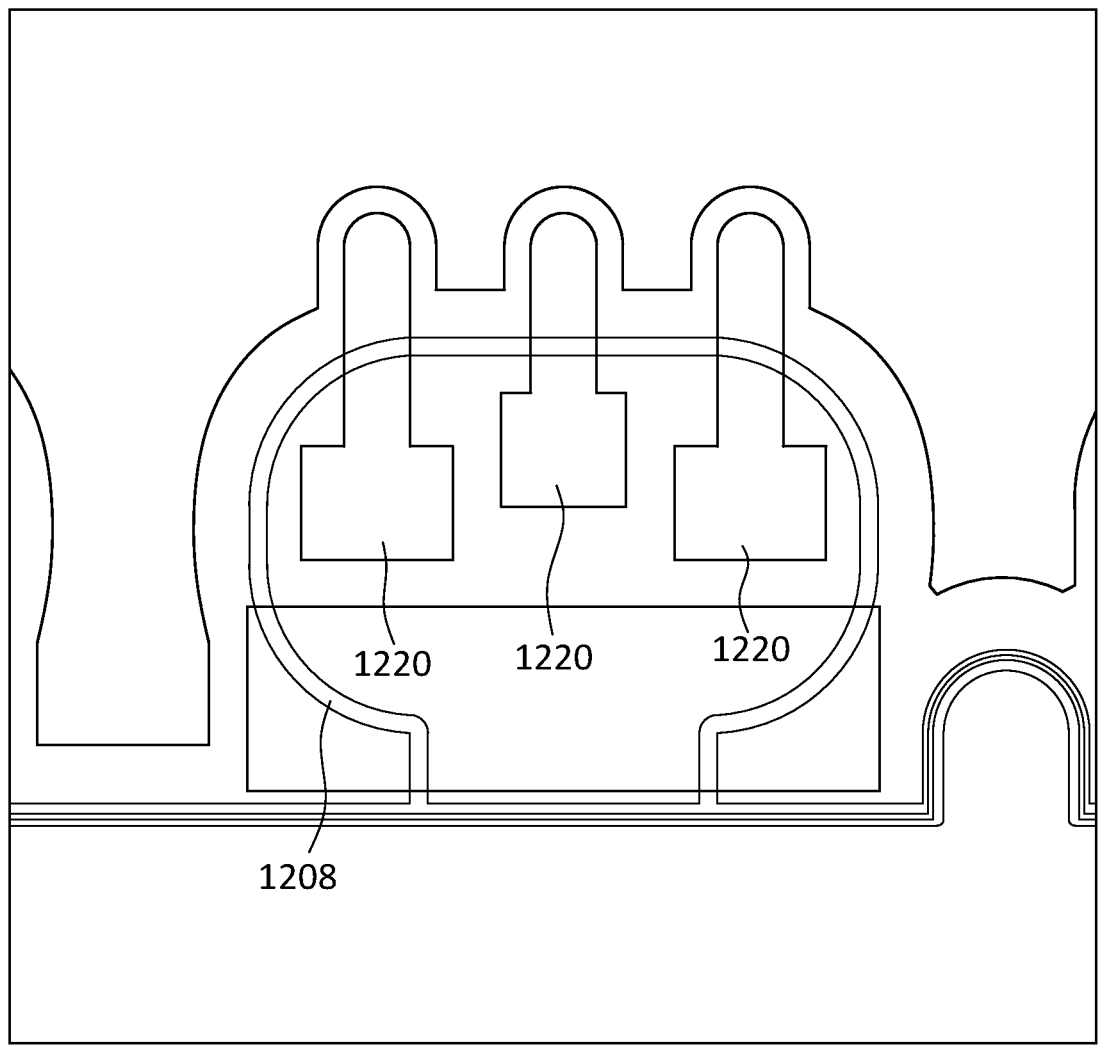
FIG. 12 illustrates a top view of pads in a cavity.

FIG. 12 illustrates a top view of pads in a cavity. One way to increase the adhesion of the pads 1220 to the PCB layer in the cavity 1208 is to increase the copper thickness. For example, the copper layer thickness may be specified as 0.5 oz/ft$^2$, 1 oz/ft$^2$, and 2 oz/ft$^2$. A thicker copper layer leads to better adhesion to the PCB layer. Further, the thicker copper layer will better dissipate heat during the manufacturing processes, which will decrease the likelihood of the copper pads delaminating from the underlying PCB layer. Further, alternating layers may be selected based on those layers that have better adhesion to the original laminate.

Figure 13:
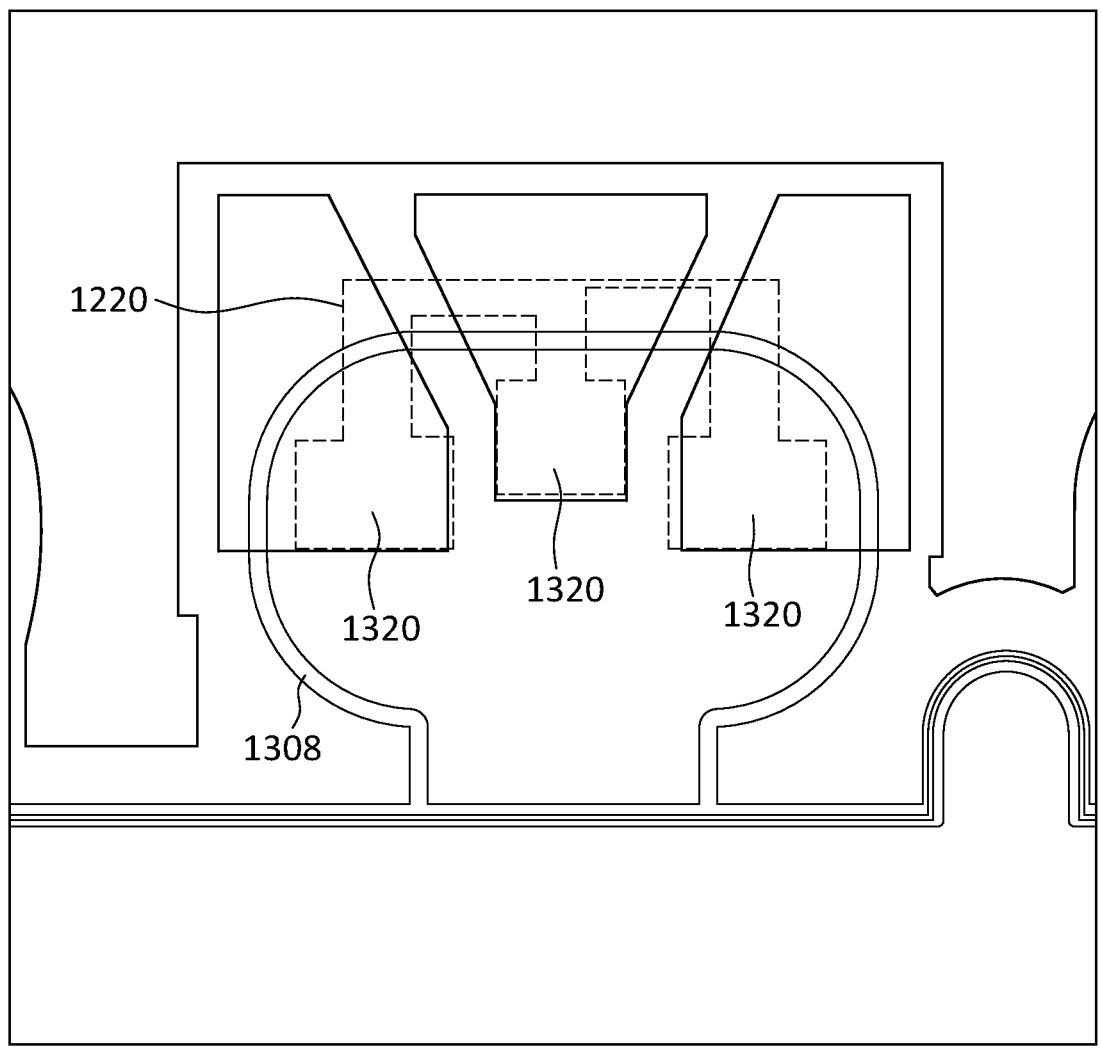
FIG. 13 illustrates a top view of another embodiment of pads in a cavity.

FIG. 13 illustrates a top view of another embodiment of pads in a cavity. The pads 1320 are larger in area than the pads 1220 shown using the dotted line. This approach increases the pad area in the cavity 1308 which allows for a larger contact area with the solder material to improve the solder adhesion. Further, the larger pad 1320 improves adhesion to the underlying PCB layer as well as improving the heat dissipation which reduces the likelihood of delamination of the pads 1320. The large pad 1320 allows for more heat to be absorbed and dissipated during the various manufacturing processed that could lead to delamination of the pads 1320.

Figure 14:
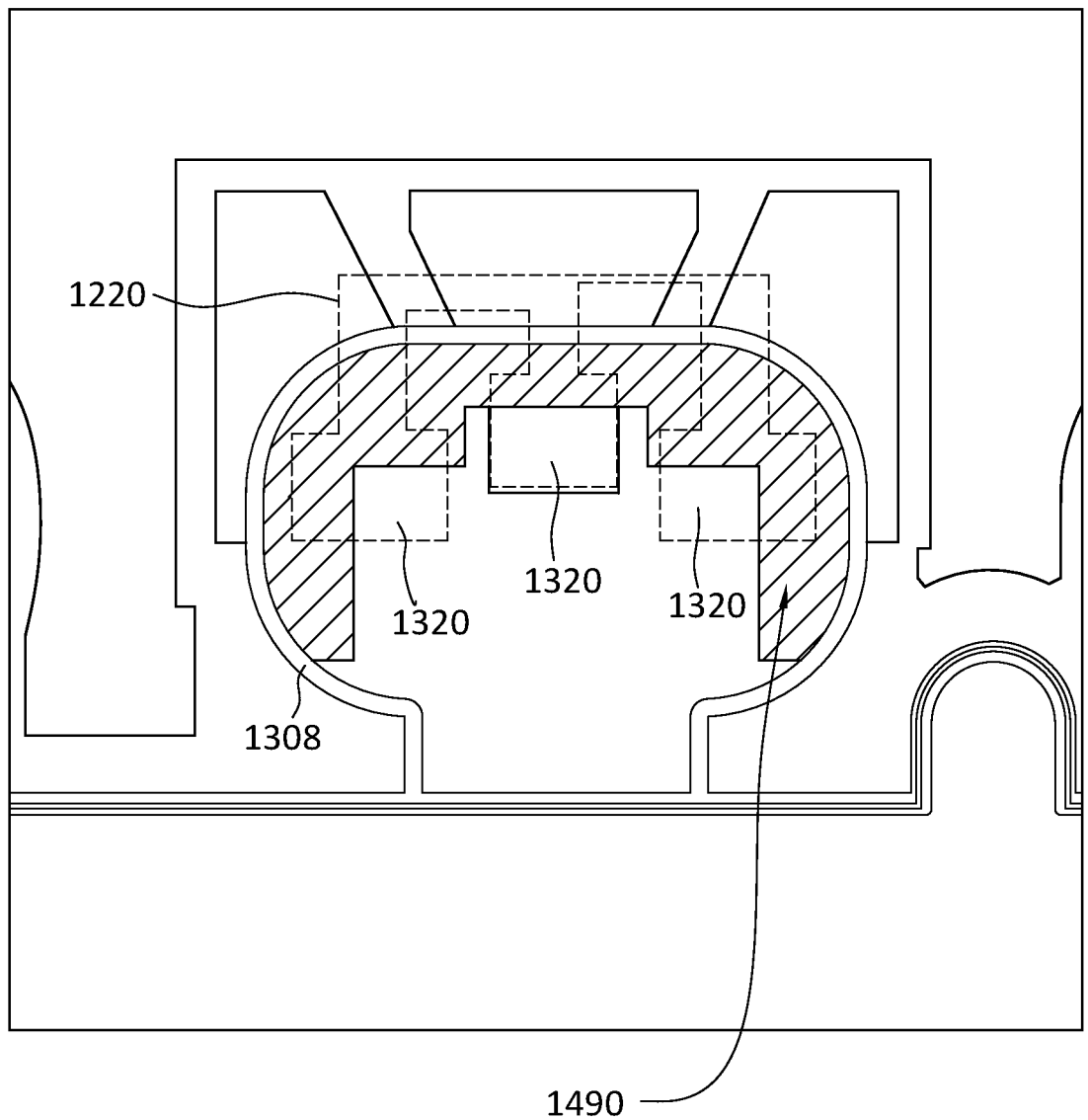
FIG. 14 illustrates a top view of another embodiment of pads in a cavity that improves pad adhesion to the PCB.

FIG. 14 illustrates a top view of another embodiment of pads in a cavity that improves pad adhesion to the PCB. In FIG. 14, when laser ablation is used to remove the final layers of the PCB board in the cavity 1308 above the pads 1320, a portion of the final layer 1490 is left in place as shown to provide an anchor to assist pad adhesion to the PCB by holding the pad down. This will help to improve the integrity of the connection between the pad and the PCB. The size of the pads may be adjusted to allow for sufficient pad area to be exposed to result in sufficient area for a reliable connection to the pad.

During the manufacture of PCBs, a conductive layer such as copper is coated on a substrate such as a resin layer. Then the conductive layer is etched to achieve the desired pattern to implement the various circuits on the PCB. In some embodiments, the conductive layer may be roughed up to improve adhesion to the adjacent substrate. Then multiple substrates or resin layers are then bonded together to form the PCB. It is noted that the conductive layer is typically more strongly bonded to its original substrate than the adjacent substrate during bonding of the substrates together. Advantage may be taken of this stronger bonding by arranging that the removed layers belong to the adjacent substrate rather than the original substrate when the milling or other removal operation is performed.

Accordingly, various embodiments have been described using PCB fabrications processes (edge milling and/or laser ablation) to expose vertical interconnect structures (for example Plated-Through-Hole vias) as well as internal horizontal interconnect (traces and pads) to provide a means of providing electrically and physical connecting and physically securing electronic components to the PCB edge. In the embodiments described herein, the placement of electronic components on the front edge of the PCB was described.

Embodiments of placing SMT electronic components on the edge of a PCB are described herein. Examples of SMT components include resistors, capacitors, inductors, sensors, light emitting diodes (LEDs), switches and contacts.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in anyway limit the invention, which is defined only by the claims.

What is claimed is:

1. A printed circuit board for mounting electrical components thereupon comprising:
   a first side;
   a second side opposite the first side;
   electrical connection points disposed on the surface of an exterior edge of the printed circuit board; and
   one or more clips, each clip having a first end attached to the first side, and a second end extending outwardly beyond the exterior edge, wherein the second end is configured to engage an interposer board,
   wherein the exterior edge of the printed circuit board is between the first side and the second side.

2. The printed circuit board of claim 1, wherein
   the exterior edge has a plurality of cavities therein, and
   the electrical connection points are disposed in at least one of the cavities.

3. The printed circuit board of claim 2, wherein the electrical connection points include printed circuit board component pads.

4. The printed circuit board of claim 2, wherein a portion of the printed circuit board layer covering the electrical connection points covers a portion of the electrical connection points in the plurality of cavities.

5. The printed circuit board of claim 1, wherein the electrical connection points comprise exposed vertical interconnect structures.

6. The printed circuit board of claim 5, wherein the vertical interconnect structures had been exposed by at least one of edge milling and laser ablation operations.

7. The printed circuit board of claim 5, wherein the vertical interconnect structures comprise plated through hole vias.

8. The printed circuit board of claim 5, further comprising:
   an interposer board with electronic components mounted on a first side, and a second side with lands connected to the electronic components.

9. The printed circuit board of claim 8, wherein the lands of the interposer board are soldered to the vertical interconnect structures of the printed circuit board.

10. The printed circuit board of claim 8, further comprising:
    electrical interconnects attached to the lands of the interposer board, wherein the electrical interconnects include connection pins configured to engage the vertical interconnect structures;
    wherein the one or more clips are configured to engage the interposer board and to secure the interposer board to the printed circuit board.

11. The printed circuit board of claim 8, further comprising:
    one or more connectors that are connected to the interposer board.

12. The printed circuit board of claim 11, wherein at least one connector of the one or more connectors includes at least one spring-loaded pin.

13. The printed circuit board of claim 1, wherein
    the exterior edge has a ledge formed thereon, and
    the electrical connection points are disposed on the ledge.

14. A printed circuit board for mounting electrical components thereupon comprising:
    a first side;
    a second side opposite the first side;
    electrical connection points disposed on the surface of an exterior edge of the printed circuit board; and
    wherein the exterior edge of the printed circuit board is between the first side and the second side,
    wherein the electrical connection points comprise exposed vertical interconnect structures, and further comprising:
    an interposer board with electronic components mounted on a first side thereof, and a second side thereof with lands connected to the electronic components, wherein the lands are connected to the vertical interconnect structures.

15. The printed circuit board of claim 14, wherein the lands of the interposer board are soldered to the vertical interconnect structures of the printed circuit board.

16. The printed circuit board of claim 14, further comprising:
    electrical interconnects attached to the lands of the interposer board, wherein the electrical interconnects include connection pins configured to engage the vertical interconnect structures; and
    a plurality of clips attached to the printed circuit board configured to engage the interposer board and to secure the interposer board to the printed circuit board.

17. The printed circuit board of claim 14, further comprising:
one or more connectors that are connected to the second side of the interposer board.

18. The printed circuit board of claim 17, wherein at least one connector of the one or more connectors includes at least one spring-loaded pin.

\* \* \* \* \*